US012811107B2

(12) United States Patent
Wang et al.

(10) Patent No.: US 12,811,107 B2
(45) Date of Patent: Nov. 24, 2026

(54) PLASMA ETCH-DEPOSITION PROCESSES AND SYSTEMS

(71) Applicant: Tokyo Electron Limited, Tokyo (JP)

(72) Inventors: Peng Wang, Albany, NY (US); Emilia Hirsch, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 175 days.

(21) Appl. No.: 18/611,370

(22) Filed: Mar. 20, 2024

(65) Prior Publication Data

US 2025/0299927 A1 Sep. 25, 2025

(51) Int. Cl.

| | |
|---|---|
| ***H01J 37/32*** | (2006.01) |
| ***H10P 14/22*** | (2026.01) |
| ***H10P 50/24*** | (2026.01) |
| *H10P 14/68* | (2026.01) |
| *H10P 50/28* | (2026.01) |
| *H10P 95/00* | (2026.01) |

(52) U.S. Cl.

CPC .. *H01J 37/32449* (2013.01); *H01J 37/32091* (2013.01); *H01J 37/32743* (2013.01); *H01J 37/32853* (2013.01); *H10P 14/22* (2026.01); *H10P 50/242* (2026.01); *H01J 2237/3341* (2013.01); *H10P 14/683* (2026.01); *H10P 50/282* (2026.01); *H10P 95/02* (2026.01)

(58) Field of Classification Search

CPC ........... H01J 37/32449; H01J 37/32091; H01J 37/32743; H01J 37/32853; H01J 2237/3341; H10P 14/22; H10P 50/242; H10P 14/683; H10P 50/282; H10P 95/02

See application file for complete search history.

(56) References Cited

U.S. PATENT DOCUMENTS

| | | | | |
|---|---|---|---|---|
| 7,569,491 | B2 * | 8/2009 | Faguet | C23C 16/045 216/99 |
| 7,790,614 | B2 * | 9/2010 | Nishimura | H10W 20/063 438/624 |
| 9,520,270 | B2 | 12/2016 | Mohanty et al. | |
| 9,607,834 | B2 | 3/2017 | Matsumoto et al. | |
| 10,497,647 | B2 | 12/2019 | Baek et al. | |
| 11,837,471 | B2 | 12/2023 | Lutker-Lee et al. | |

(Continued)

FOREIGN PATENT DOCUMENTS

| | | | |
|---|---|---|---|
| EP | 2608247 | A1 | 6/2013 |
| JP | 6017928 | B2 | 11/2016 |

(Continued)

*Primary Examiner* — Anita K Alanko

(74) *Attorney, Agent, or Firm* — Slater Matsil, LLP

(57) ABSTRACT

A method of processing a substrate in a plasma processing chamber includes loading a patterned substrate within a plasma processing chamber including a sacrificial electrode and a bottom electrode. The method further includes consuming the sacrificial electrode to deposit a blanket layer over a patterned substrate, the patterned substrate including a layer to be patterned, a patterned planarizing layer disposed on the layer to be patterned, and a patterned anti-reflection layer disposed over the patterned planarizing layer, the blanket layer closing gaps between adjacent patterned planarizing layer to form cavities. And the method further includes thinning the blanket layer to open the cavities, and extending the cavities into the layer to be patterned using a plasma etching process.

20 Claims, 5 Drawing Sheets

(56) References Cited

U.S. PATENT DOCUMENTS

| | | | | |
|---|---|---|---|---|
| 2003/0113997 | A1* | 6/2003 | Lai | H10W 20/038 257/E21.585 |
| 2006/0099824 | A1* | 5/2006 | Liu | H10P 14/68 438/758 |
| 2010/0323525 | A1 | 12/2010 | Chi et al. | |
| 2011/0260326 | A1 | 10/2011 | Clevenger et al. | |
| 2013/0237059 | A1 | 9/2013 | Ranjan et al. | |
| 2014/0134848 | A1 | 5/2014 | Hisamatsu et al. | |
| 2015/0228497 | A1 | 8/2015 | De Schepper et al. | |
| 2016/0314982 | A1 | 10/2016 | Kihara et al. | |
| 2016/0379824 | A1 | 12/2016 | Wise et al. | |
| 2019/0198338 | A1 | 6/2019 | Kim et al. | |

FOREIGN PATENT DOCUMENTS

| | | | |
|---|---|---|---|
| KR | 20120041334 | A | 5/2012 |
| KR | 20150078100 | A | 7/2015 |
| KR | 20150093618 | A | 8/2015 |
| KR | 20170000361 | A | 1/2017 |
| WO | 2018213318 | A1 | 11/2018 |

* cited by examiner

PLASMA ETCH-DEPOSITION PROCESSES AND SYSTEMS

TECHNICAL FIELD

The present invention relates generally to semiconductor manufacturing processes, and, in particular embodiments, to plasma etch-deposition processes and systems.

BACKGROUND

In the field of semiconductor manufacturing, the scaling down of feature sizes has increased the demands for precision and uniformity in patterning processes. Plasma etching is a fundamental technique used to create intricate patterns on semiconductor wafers. The precision of this patterning process is crucial for the successful fabrication of semiconductor devices. Local critical dimension uniformity (LCDU) is a measure of critical dimension (CD) variations for patterns (such as channel holes, or holes for contact plugs/vias) within a localized area on a semiconductor wafer, where the size of the localized area depends on the feature size and pattern density of the patterns and is typically of the order of a few micrometers squared ($\mu m^2$). LCDU typically originates from the stochastic variations in the lithography processes and may be modified by etching processes. The improvement of LCDU is essential for the production of higher performance devices and yield of devices.

Traditional plasma etching processes pose several challenges that can result in non-uniformities, such as line edge roughness (LER), line width roughness (LWR), and pattern collapse. These non-uniformities arise due to various factors including but not limited to non-uniform plasma density, irregularities in mask layers, or by-products from etch processes that can re-deposit onto the patterned features. These challenges lead to worse LCDU, which undermines device performance and manufacturability.

SUMMARY

A method of processing a substrate in a plasma processing chamber includes loading a patterned substrate within a plasma processing chamber including a sacrificial electrode and a bottom electrode. The method further includes consuming the sacrificial electrode to deposit a blanket layer over a patterned substrate, the patterned substrate including a layer to be patterned, a patterned planarizing layer disposed on the layer to be patterned, and a patterned anti-reflection layer disposed over the patterned planarizing layer, the blanket layer closing gaps between adjacent patterned planarizing layer to form cavities. And the method further includes thinning the blanket layer to open the cavities, and extending the cavities into the layer to be patterned using a plasma etching process.

A method of processing a substrate in a plasma processing chamber includes loading a patterned substrate into a plasma processing chamber, the patterned substrate including a layer to be patterned, a patterned planarizing layer disposed on the layer to be patterned, and a patterned anti-reflection layer disposed over the patterned planarizing layer, the plasma processing chamber including a top electrode and a bottom electrode. The method further includes depositing a blanket layer over the patterned substrate, the depositing including powering a first plasma within the plasma processing chamber by applying a first RF power to the bottom electrode while applying a DCS pulse to the top electrode, the blanket layer closing gaps between adjacent patterned planarizing layer to form cavities. The method further includes etching the blanket layer to open the cavities, the etching including powering a second plasma within the plasma processing chamber by applying a second RF power to the bottom electrode. And the method further includes extending the cavities into the layer to be patterned, the extending including powering a third plasma within the plasma processing chamber by applying a third RF power to the bottom electrode.

A plasma processing system includes a plasma processing chamber including a first electrode and a second electrode, the first electrode being a sacrificial electrode, the second electrode configured to hold a substrate. The system further includes a direct current superposition (DCS) power supply electrically coupled to the first electrode, a source power supply electrically coupled to the second electrode, and a bias power supply electrically coupled to the second electrode. The system further includes a controller electrically coupled to the plasma processing chamber, the bias power supply, the source power supply, and the DCS power supply. And the system further includes a memory electrically coupled to the controller and storing a set of instructions to be executed by the controller, the set of instructions when executed cause the controller to apply a first RF power to the second electrode with the source power supply while applying a DCS pulse to the first electrode with the DCS power supply so as to deposit a blanket layer over a patterned substrate disposed on the second electrode, the blanket layer closing gaps between adjacent patterned planarizing layer to form cavities, the patterned substrate including a layer to be patterned, a patterned planarizing layer disposed on the layer to be patterned, and a patterned anti-reflection layer disposed over the patterned planarizing layer. The set of instructions when executed further cause the controller to apply a second RF power with the source power supply to the second electrode, and a first bias power (BP) potential with the bias power supply to the second electrode so as to etch the blanket layer. And the set of instructions when executed further cause the controller to apply a third RF power with the source power supply to the second electrode, and a second BP potential with the bias power supply to the second electrode so as to extend the cavities into the layer to be patterned.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
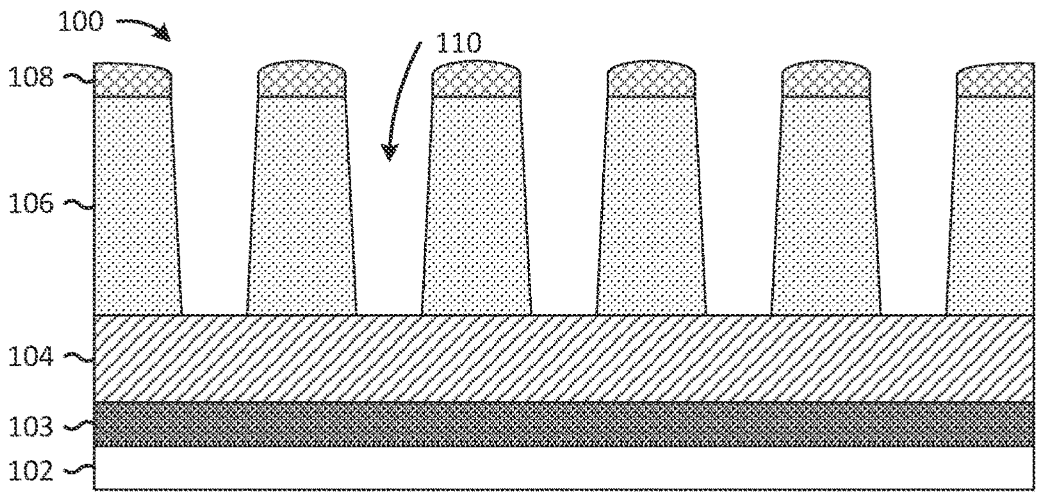
FIGS. 1A-1D illustrate cross-sectional schematic diagrams of a patterned substrate through the various steps of a substrate processing method in accordance with an embodiment.

A conventional tri-layer etching method is a semiconductor fabrication technique widely employed for patterning features with high aspect ratios and precise critical dimensions. This method typically employs a stack comprising three distinct layers: a planarization layer (such as an organic planarization layer (OPL)) for topography correction to prior stacks and patterns to minimize the depth of focus variations at lithography exposure, an intermediate hard mask layer often made of silicon-containing materials which may (by itself or by combining with an additional thin layer of organic material) serve as a bottom anti-reflective coating (BARC), and a top photoresist layer that is patterned using photolithography. The process begins with transferring the photolithographically defined pattern from the top photoresist layer to the intermediate hard mask layer and then to the planarization layer using an etch process, followed by another etch step that transfers the pattern from the planarization layer to the substrate or the layer intended for patterning.

Despite its widespread use, the conventional tri-layer etching method encounters several difficulties. One of the challenges is the control of etch selectivity between the layers, which is crucial for maintaining pattern fidelity and preventing damage to the underlying layers. Additionally, as device geometries continue to shrink, the aspect ratios of the features increase, making it more challenging to achieve uniform etch profiles without causing faceting or footing. Another difficulty arises from the removal of the anti-reflective coating to etch the layer to be patterned. During the removal of the anti-reflective coating, middle profile bowing of the features occurs from ion deflection from the anti-reflective coating into the sidewalls of the features in the planarization layer. Further, the ion deflection may also cause top profile faceting due to ion sputtering of the top features of the pattern. Both the top profile faceting from ion sputtering and the middle profile bowing from ion deflection contribute to worse local critical dimension uniformity (LCDU), which is another challenge of conventional plasma etch processes used in tri-layer etching methods.

This disclosure describes a substrate processing method using a plasma etching process to form high aspect ratio features using a blanket layer to top-seal the features for the removal of an anti-reflection layer to prevent ion deflection and ion sputtering and improve LCDU of the formed features. The substrate processing method of this disclosure improves LCDU of the channel holes, or holes for contact plugs/vias formed by using the blanket layer to top-seal the features for the anti-reflection layer removal, and the blanket layer may be deposited in-situ using a Direct Current Superposition (DCS) plasma etching process described below. Further, by incorporating the deposition of the blanket layer in-situ, there is no increase in complexity of the fabrication process, which improves LCDU of the features without increasing complexity. As a result, fabrication processes do not have increased costs by incorporating the substrate processing method of this disclosure.

Figure 2:
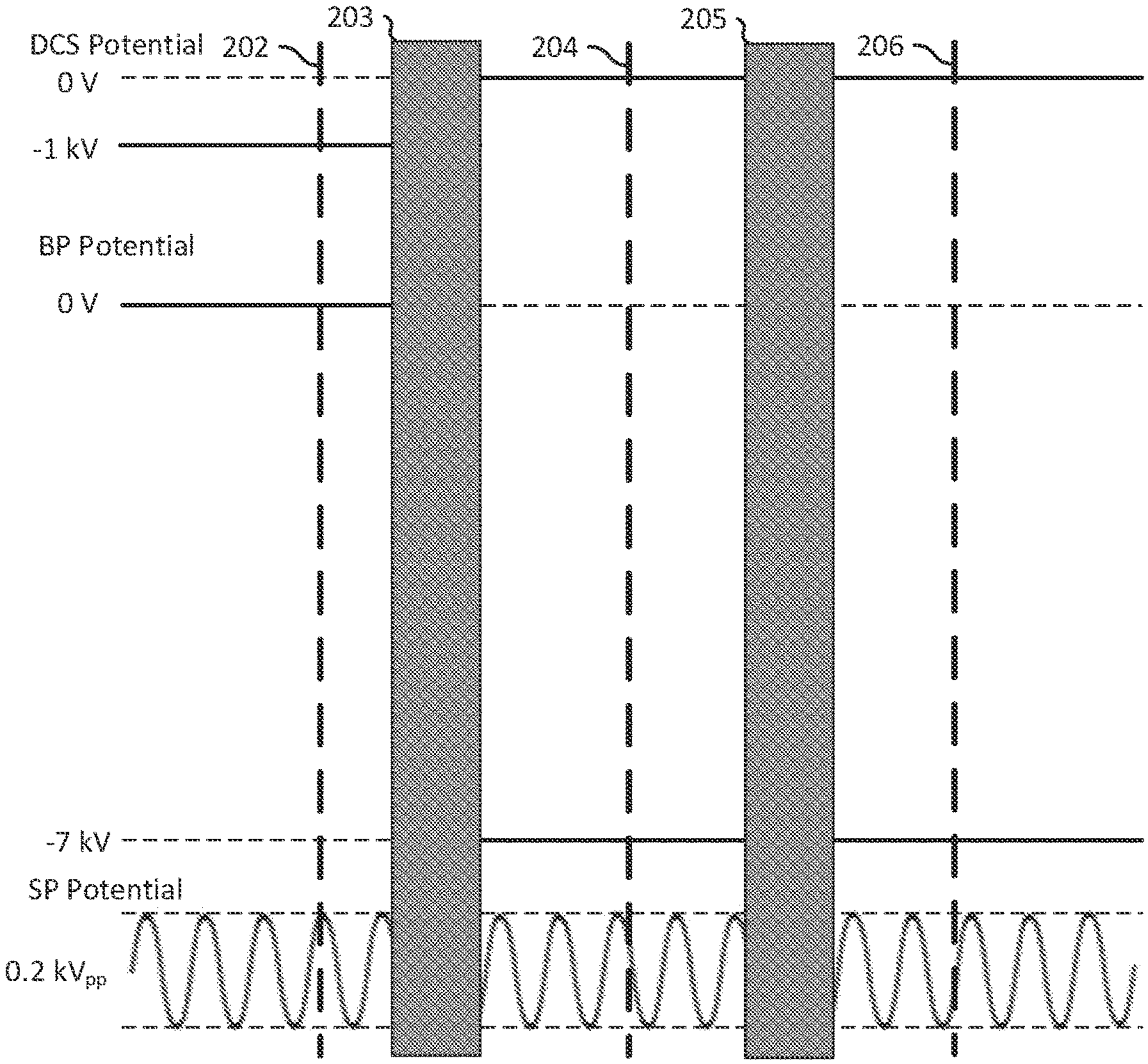
FIG. 2 is a plot illustrating waveforms implemented in a Direct Current Superposition (DCS) plasma etching process which may be used in the substrate processing method of this disclosure in accordance with an embodiment.
Figure 3:
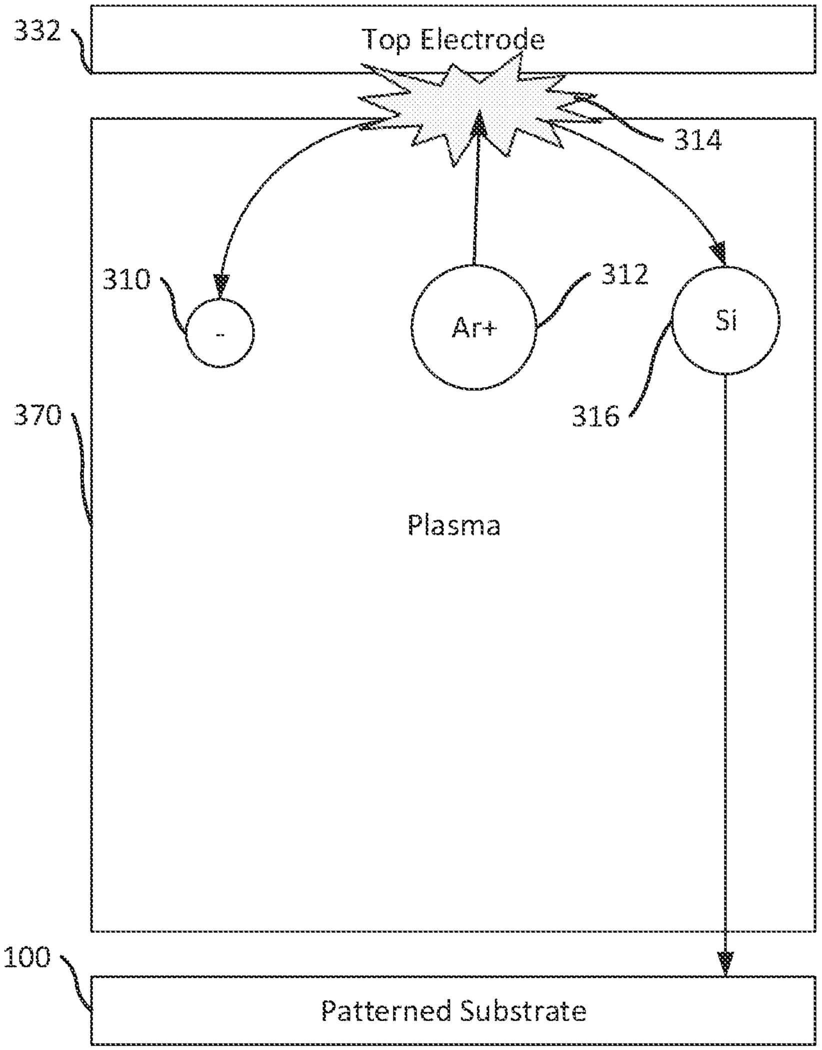
FIG. 3 is a schematic diagram illustrating the behavior of elements of a plasma used to sputter a top electrode of a plasma processing chamber to deposit a blanket layer over a patterned substrate and top-seal adjacent features in accordance with an embodiment.
Figure 4:
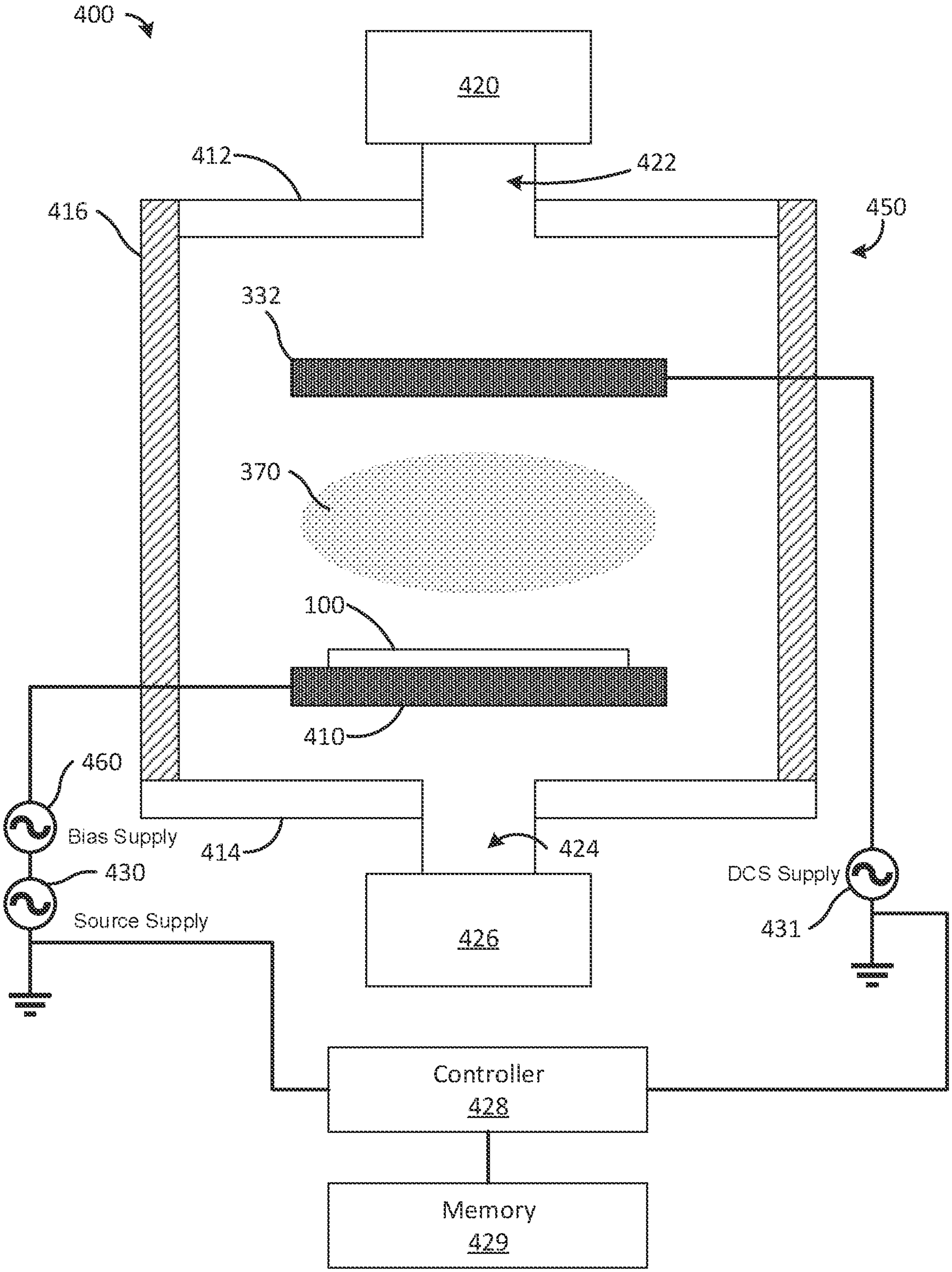
FIG. 4 illustrates an example plasma etching system capable of implementing a substrate processing method of this disclosure in accordance with an embodiment.

Embodiments provided below describe various methods, apparatuses and systems of a substrate processing method to form channel holes, or holes for contact plugs/vias with improved LCDU, and in particular, to methods, apparatuses, and systems that use an in-situ top-sealing blanket layer to planarize a patterned substrate before etching features into a layer to be patterned of the patterned substrate. The following description describes the embodiments. FIGS. 1A-1D illustrate the steps of the substrate processing method of this disclosure in an embodiment. FIG. 2 is used to describe a DCS plasma etching process which may be used to deposit a blanket layer on the patterned substrate and top-seal the features. FIG. 3 is a schematic diagram used to illustrate the behavior of elements of a plasma used to deposit a top-sealing blanket layer over features in a patterned substrate. An example plasma processing system which may be configured to implement the substrate processing method of this disclosure is illustrated in FIG. 4. An example substrate processing method of this disclosure is described using the flowchart of FIG. 5. And FIG. 6 is used to illustrate, in a flowchart, another example embodiment method of this disclosure of a substrate processing method which uses a top-sealing blanket layer to improve the LCDU of the channel holes, or holes for contact plugs/vias being formed.

FIGS. 1A-1D illustrate cross-sectional view schematic diagrams of a patterned substrate for each of the steps of a substrate processing method of this disclosure in an embodiment. The substrate processing method of this disclosure top-seals a feature pattern of the patterned substrate in-situ to improve LCDU of features to be formed, such as channel holes, or holes for contact plugs/vias. For example, the substrate processing method of this disclosure may replace a conventional tri-layer mask method for forming channel holes, or holes for contact plugs/vias.

FIG. 1A illustrates a cross-sectional view schematic diagram of a patterned substrate 100. The patterned substrate 100 comprises a substrate 102, an underlayer 103 disposed over the substrate 102, a layer to be patterned 104 disposed over the underlayer 103, a patterned planarizing layer 106 disposed over the layer to be patterned 104, and a patterned anti-reflection layer 108 disposed over the patterned planarizing layer 106. Further, the patterned elements of the patterned substrate 100 are patterned with features 110, which may have been patterned through conventional patterning/substrate manufacturing processes. For example, in a prior processing step, a conventional photolithography process may have been used to form a feature pattern and a subsequent etch step may have been used to transfer the feature pattern to a substrate to form the features 110 in the patterned substrate 100. The conventional photolithography process comprises coating the substrate with photoresist, and exposing the photoresist to light through a patterned mask to form a patterned coating on the substrate (after removing the unexposed areas of the photoresist). After forming the patterned coating, a selective etch step may have been used to transfer the feature pattern to the substrate and form the patterned substrate 100.

In various embodiments, the features 110 may be channel holes, or holes for contact plugs/vias. The patterned substrate 100 may be used as the starting patterned substrate for the substrate processing method of this disclosure.

The substrate 102 of FIG. 1A may be a silicon wafer, or any wafer appropriate for fabricating the semiconductor device. For example, the substrate 102 may be any semiconducting substrate known in the art, such as monocrystalline silicon, IV-IV compounds such as silicon-germanium or silicon-germanium-carbon, III-V compounds, II-VI compounds, epitaxial layers over such substrates, electrically conductive layers (e.g., electrodes and/or interconnects) over such substrates, or any other semiconducting or nonsemiconducting material, or dielectric materials such as silicon oxide, silicon nitride, silicon carbon, glass, plastic, ceramic substrate, or metal substrate such as tungsten, titanium nitride, etcetera. The underlayer 103 may comprise integrated circuits fabricated on the substrate 102, such as driver circuits for a memory device. In other embodiments, the underlayer 103 may be a layer of a semiconducting material, of a conducting material, or of an insulating material. In other embodiments, the patterned substrate 100 may not have an underlayer 103, and instead the layer to be patterned 104 is disposed directly over the substrate 102.

The configuration of FIGS. 1A-1D may represent a general etching process for forming channel holes, or holes for contact plugs/vias and is not limited to any specific materials or patterns. For example, the layer to be patterned 104 may be any suitable material, but is a dielectric in various embodiments. In one embodiment, the layer to be patterned 104 is a dielectric that includes an oxide. For example, the dielectric may include silicon dioxide ($SiO_2$). In various other embodiments, other oxides may be used, such as aluminum oxide ($Al_2O_3$, commonly referred to as sapphire), and others. In one embodiment, the dielectric includes a nitride, such as silicon nitride ($Si_3N_4$).

The layer to be patterned 104 may be a homogeneous material (such as $SiO_2$) or it may be a stack of any number of materials. In some embodiments, the layer to be patterned 104 is a stack including an oxide and a nitride, and is an alternating stack of oxides and nitrides (often referred to as an ONO stack). For example, the layer to be patterned 104 may be an ONO stack including tens to hundreds of alternating $SiO_2$ and $Si_3N_4$ layers. Such a configuration may be used in various applications, such as a high aspect-ratio contact (HARC) etch for memory (e.g. 3D-NAND, DRAM, etc.). In the specific example of a HARC etch, the underlayer 103 may be a semiconductor layer (e.g. a device layer) with which electrical contact is being made using the substrate processing method of this disclosure to form HARC features, such as channel holes, or holes for contact plugs/vias, with improved LCDU.

In various embodiments, the patterned planarizing layer 106 may be an organic planarizing layer (OPL), which has been patterned with the features 110 to form channel holes, or holes for contact plugs/vias in the layer to be patterned 104 to the underlayer 103. In embodiments where the patterned planarizing layer 106 is an OPL, the OPL may be any self-planarizing organic planarization material employed for an OPL in tri-layer lithography methods known in the art, such as, for example, spin-on carbon (SOC), diamond-like carbon, polyarylene ether, or polyimide. The patterned planarization layer 106 may have been formed by spin coating and patterned with the features 110 using conventional methods known in the art.

The patterned anti-reflection layer 108 may be a silicon anti-reflective coating (SiARC) which may include a silicon-containing polymer in an embodiment. In various other embodiments, the patterned anti-reflection layer 108 may be SiON, or Low Temperature Oxide (LTO) combined with BARC, or other suitable materials known in the art for use as an anti-reflection layer. The patterned anti-reflection layer 108 may have been applied by spin coating and patterned with the features 110 using conventional methods known in the art. For example, the features 110 may have been patterned using a photolithography process and then etched using a pattern transfer etch into the patterned anti-reflection layer 108 and the patterned planarizing layer 106. The pattern transfer etch may be an anisotropic etch. In one embodiment, the features 110 may have been patterned into the anti-reflection layer 108 and the patterned planarizing layer 106 using a reactive ion etch (RIE). In other embodiments, a plasma etching process may have been used to pattern the patterned layers.

Figure 1B:
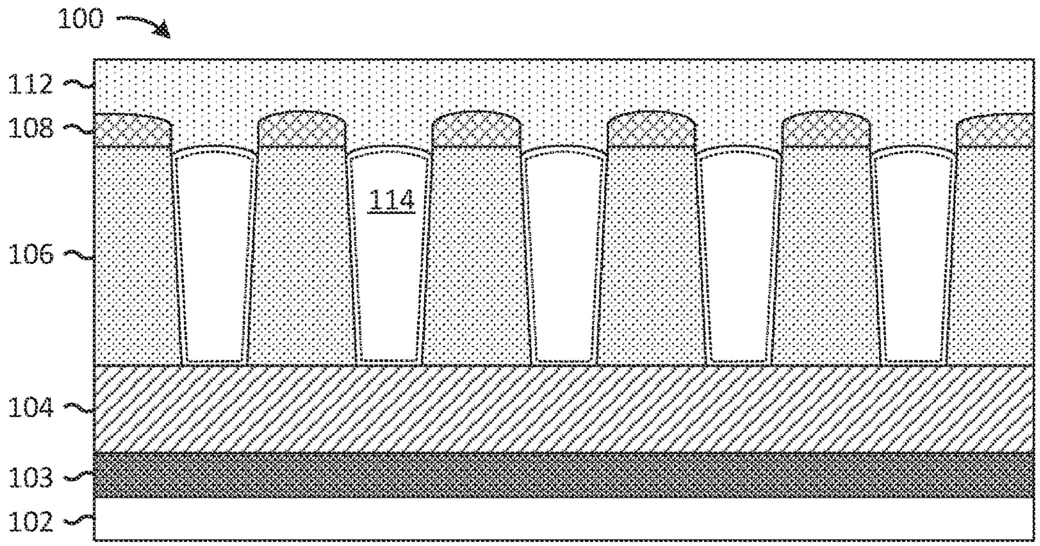

After forming the patterned substrate 100, the substrate processing method of this disclosure deposits a blanket layer over the patterned substrate 100. FIG. 1B illustrates a cross-sectional view of the patterned substrate 100 after depositing a blanket layer 112 in-situ to top-seal the features 110 and form cavities 114.

Referring to FIG. 1B, the blanket layer 112 may be deposited over the patterned anti-reflection layer 108 and planarize the top surface of the patterned substrate 100 for further etching. By forming the blanket layer 112 over the patterned substrate, the features 110 are top-sealed to form the cavities 114 and the patterned substrate 100 is planarized for the next etch step which will form the features 110 into the layer to be patterned 104. The top-sealing of the patterned substrate 100 results in the subsequent etch process improving LCDU of the formed features, and the top-sealing also results in a narrower ion angular distribution for ions used to etch the features which also minimizes distortions of the patterned planarizing layer 106 during the subsequent etch step. Further, the blanket layer 112 enables the patterned anti-reflection layer 108 to be removed with the blanket layer 112 without ion sputtering of the anti-reflection layer 108 and ion deflection off of the anti-reflection layer 108 causing profile distortions of the patterned planarizing layer 106. All of these improve LCDU and mitigate challenges encountered using conventional techniques.

The blanket layer 112 may comprise any material of a highly sticky species/material such that the sticky material sticks to and accumulates on the top of the features 110 without depositing on the bottom of the features 110 over the layer to be patterned 104. Further, the blanket layer 112 may be deposited using any suitable deposition process that generates a highly sticky species/material that will stick to the tops of the features 110 and form the blanket layer 112. For example, the blanket layer 112 may be deposited using a sputtering process in a Direct Current Superposition (DCS) plasma etching process.

In an embodiment, the blanket layer 112 may be deposited using a DCS plasma etching process, such as the DCS plasma etching process described using FIG. 2. During the DCS plasma etching process, ions of a plasma may be used to sputter a top electrode of a plasma processing chamber to deposit the blanket layer 112 over the patterned substrate 100. For example, in an embodiment, the DCS plasma etching process may be used with an argon plasma and the argon ions may sputter a top electrode comprising silicon. In that embodiment, the argon ions sputter the silicon top electrode and a highly sticky silicon material (sputtered from the top electrode) forms over the patterned anti-reflection layer 108 without depositing at the bottom of the features 110. As a result, the sticky silicon material forms a planarizing blanket layer 112 over the features 110 forming cavities 114 and top-sealing the features without depositing on the bottom of the features over the layer to be patterned 104.

In an embodiment using the DCS plasma etching process described above, the blanket layer 112 may also comprise sticky species/materials that were etched from the patterned anti-reflection layer 108. As a result, the blanket layer 112 may be formed from a combination of the sputtering of the silicon top electrode and the displacement of the material of the patterned anti-reflection layer 108 caused by the etching from the DCS plasma etching process. In an embodiment, the blanket layer 112 may comprise both sputtered silicon from the top electrode and SiARC from the patterned anti-reflection layer 108. A timing diagram of a DCS plasma etching process which may be used to deposit the top-sealing blanket layer 112 of this disclosure is shown in FIG. 2.

After forming the blanket layer 112, the substrate processing method of this disclosure performs a separate etch process to open the cavities 114 and remove the patterned anti-reflection layer 108. A benefit of the substrate processing method of this disclosure is the blanket layer 112 enables the removal of the patterned anti-reflection layer 108 without damaging the sidewalls of the features 110 through ion sputtering and ion deflection of the patterned anti-reflection layer 108 which aids in minimizing distortions of the features 110 and improves LCDU.

Figure 1C:
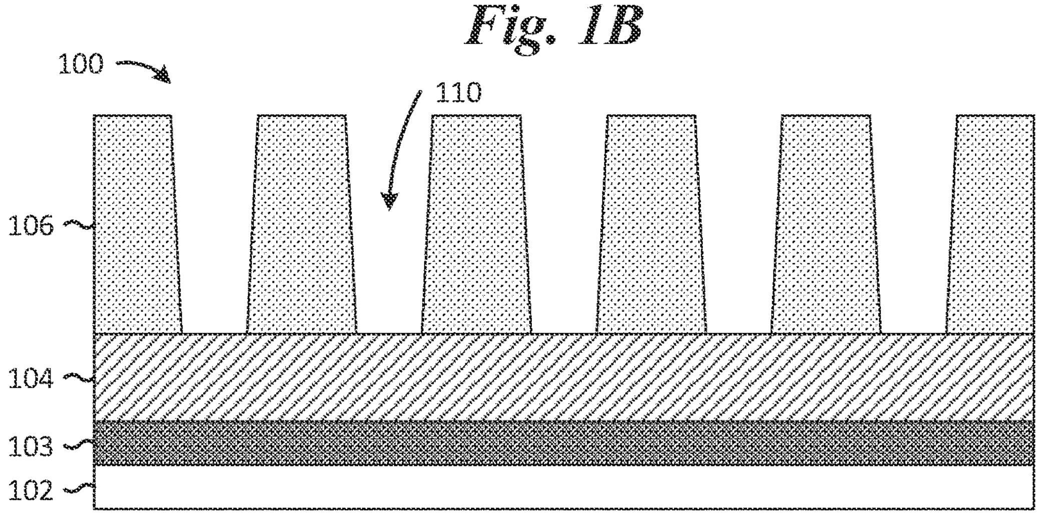

FIG. 1C illustrates a cross-sectional view schematic diagram of the patterned substrate 100 after opening the cavities 114 and removing the patterned anti-reflection layer 108. As illustrated in FIG. 1C, the blanket layer and the patterned anti-reflection layer have been removed. The patterned anti-reflection layer and the blanket layer may be removed through a plasma etching process, such as a capacitively coupled plasma (CCP) etch process, or through the DCS plasma etching process described using FIG. 2.

Referring to FIG. 1C, the patterned substrate 100 comprises the substrate 102, the underlayer 103, the layer to be patterned 104, and the patterned planarizing layer 106 with the features 110. At the point illustrated in FIG. 1C, the patterned substrate 100 is prepared to be pattern etched to form the features 110 into the layer to be patterned 104.

A plasma etching process may be used to etch the features 110 into the layer to be patterned 104 using a plasma selective to the material of the layer to be patterned 104 and not selective to the material of the patterned planarizing layer 106 or the underlayer 103 or the substrate 102. For example, in the case the layer to be patterned 104 is a dielectric material of an oxide, the plasma used to etch the features 110 into the layer to be patterned 104 may be formed using a Source Power (SP) potential at RF (e.g. 13.56 MHz) to ignite a gas mixture of $CH_3F/O_2$ or $CH_3F/CO_2$. In various other embodiments where the layer to be patterned 104 is a dielectric layer, gas mixtures of fluorocarbon ($C_xF_y$) or hydrofluorocarbon ($C_xH_yF_z$) such as $CF_4$, $C_4F_8$, $C_4F_6$, $CHF_3$, $CH_2F_2$, and $CH_3F$ gases combined with additive gases such as Ar, He, $O_2$, $H_2$, and $N_2$ may be used to etch the features 110 into the layer to be patterned 104.

Figure 1D:
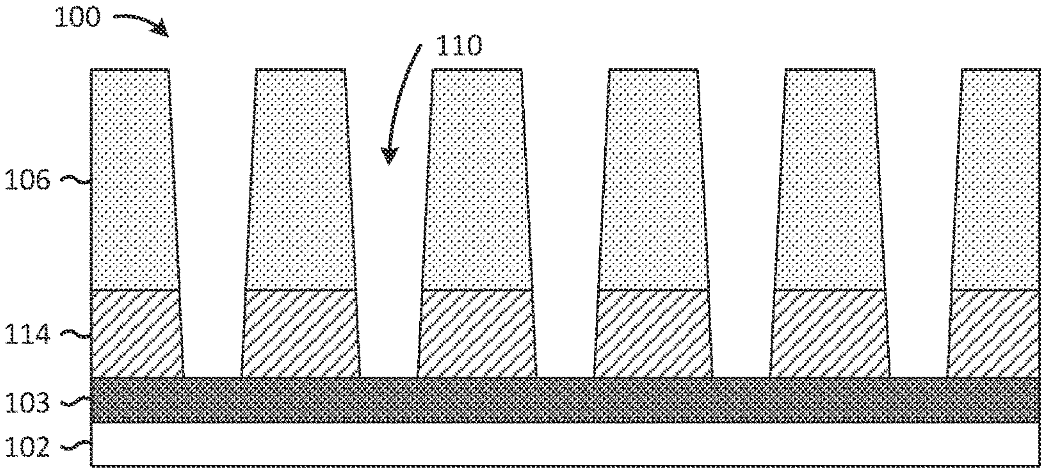

FIG. 1D illustrates a cross-sectional view schematic diagram of the patterned substrate 100 after using the plasma etching process described above to form the features 110 in the layer to be patterned 104. As illustrated in FIG. 1D, the plasma etching process of the substrate processing method of this disclosure etched the features 110 in the layer to be patterned 104 to form a patterned layer 114. The substrate processing method formed the features 110 in the patterned layer 114 without damaging the sidewalls of the features 110 in the patterned planarizing layer 106, thus eliminating middle profile bowing that results from conventional methods. Further, the substrate processing method of this disclosure does not have top profile faceting of the patterned planarizing layer 106, and the ion angular distribution is minimized. All of the benefits described above contribute to an improved LCDU over conventional methods, which is a benefit of the substrate processing method of this disclosure.

After forming the features 110 in the patterned layer 114, conventional metal fill processes may be used to finish forming the channel holes, or holes for contact plugs/vias the features 110 are intended to become according to the semiconductor device being fabricated. A timing diagram of a DCS plasma etching process which may be used to deposit the blanket layer in-situ and top-seal the features of the patterned substrate 100 according to the substrate processing method of this disclosure is illustrated in FIG. 2 and described below.

FIG. 2 illustrates a DCS plasma etching process which may be used in the substrate processing method of this disclosure. The timing diagram of FIG. 2 illustrates electrical potentials (waveforms) applied to a top electrode or a bottom electrode disposed in a plasma processing chamber of a plasma processing system, such as a CCP etching tool, to perform the DCS plasma etching process of the substrate processing method of this disclosure.

The waveform labeled DCS Potential is an example electrical potential which may be applied to the top electrode. The waveform labeled Bias Power (BP) Potential is an example electrical potential which may be applied to a bottom electrode with the patterned substrate 100 loaded on a substrate holder forming electrical contact with the bottom electrode. The BP Potential may be used to bias the patterned substrate 100 to perform the etch steps of the substrate processing method of this disclosure, such as opening the cavities and forming the features in the layer to be patterned. And the waveform labeled Source Power (SP) Potential may be applied to the bottom electrode (and patterned substrate 100) to ignite a gas mixture to form the various plasmas used between the top electrode and the bottom electrode. When the BP Potential and the SP Potential are on, their signals are superimposed and applied to the bottom electrode.

A first phase 202 is represented by the vertical dashed line and represents the timeframe between the start of the DCS plasma etching process and the start of a first purge step 203. During the first phase 202, the DCS Potential is high (at −1 kV), the BP Potential is low (at 0V), and the SP Potential is actively applied to the bottom electrode to ignite a first gas mixture into a first plasma. The first phase 202 uses the first plasma to sputter the top electrode and deposit a blanket layer over the patterned substrate 100. For example, the first phase 202 may be illustrated as the step that deposits the blanket layer 112 over the patterned substrate 100 as illustrated in FIG. 1B.

The positive ions of the first plasma are accelerated to the top electrode during the first phase 202. As a result, the positive ions collide with the top electrode and sputter material off, which then deposits on the patterned substrate 100. The sputtered material from the top electrode is highly sticky and may be used to form a blanket layer that does not deposit material in the features being formed. The stickiness of the sputtered material and the thickness of the blanket layer may both be controlled by varying parameters of waveforms of the first phase 202. For example, if the timeframe of the first phase 202 is increased, the amount of sputtered material and consequently the thickness of the blanket layer deposited is also increased. In other embodiments, the various phases of the DCS plasma etching process may be repeated, or comprise multiple pulses to deposit, or etch according to the specifications of the substrate processing method.

After depositing the blanket layer using the first phase 202 of FIG. 2, a first purge 203 may be used to remove the first plasma and the first gas mixture used to form the first plasma from the plasma processing chamber. In an embodiment, all of the potentials may be turned off during the first purge 203. The first purge 203 may be any process known in the art which removes the first plasma and first gas mixture from the plasma processing chamber.

The DCS plasma etching process illustrated in FIG. 2 proceeds to the etch step to remove the blanket layer and patterned anti-reflection layer after the first purge 203. A second phase 204 may be the etch step of the substrate processing method of this disclosure which removes the blanket layer and patterned anti-reflection layer as described above. During the second phase 204, the DCS Potential is low (at 0V), the BP Potential is high (at −7 kV), and is superimposed with the SP Potential (at 0.2 $kV_{pp}$) on the bottom electrode. A second gas mixture may be introduced to the plasma processing chamber during the second phase 204. The SP Potential may ignite the second gas mixture into a second plasma, and the BP Potential on the bottom electrode accelerates the positive ions of the second plasma to collide and etch the blanket layer and patterned anti-reflection layer of the patterned substrate 100.

Again, parameters of the set of waveforms of the second phase 204 may be varied to control aspects of the etch process. For example, the timeframe of the second phase 204 may be tuned such that the blanket layer and the patterned anti-reflection layer are completely removed from the patterned substrate, such as the embodiment illustrated in FIG. 1C.

Once the blanket layer and the patterned anti-reflection layer have been removed using the etch process of the second phase 204, the DCS plasma etching process proceeds with a second purge 205. The second purge 205 removes the second gas mixture and the second plasma from the plasma processing chamber through a suitable method. During the second purge 205, all of the potentials are powered down.

Still referring to FIG. 2, the DCS plasma etching process, after the second purge 205, proceeds to a third phase 206 to pattern etch the features into the layer to be patterned of the patterned substrate. In an embodiment, a third gas mixture may be injected into the plasma processing chamber and ignited using the RF Source provided by the SP Potential to the bottom electrode into a third plasma. The DCS Potential is low (at 0V), the BP Potential is high (at −7 kV), and the SP Potential is high (at 0.2 $kV_{pp}$) during the third phase 206. And during the third phase 206, the third plasma may be used to etch the features of the patterned planarizing layer into the layer to be patterned to form the patterned layer.

The third phase 206 applies a negative BP Potential on the bottom electrode, which accelerates positive ions of the third plasma into the patterned substrate to etch the exposed regions of the layer to be patterned and form the features according to the semiconductor device being fabricated. In various embodiments, the third gas mixture comprises gases that, when ignited by the RF Source from the SP Potential, forms a third plasma that may selectively etch the material of the layer to be patterned over the materials of the other layers. In an embodiment, the third phase 206 may be the plasma etch process that etches the layer to be patterned to form the patterned layer, such as in FIG. 1D above. After etching the features into the layer to be patterned to form the patterned layer on the patterned substrate, further steps may be performed to finish forming the semiconductor device.

In other embodiments, rather than the amplitudes of the BP Potential of the second phase 204 and the third phase 206 remaining the same, the bias amplitudes may be uniquely configured for each phase and vary throughout the process. Further, the timeframes between the phases may vary as well.

In other embodiments, the DCS plasma etching process may be replaced with another plasma etching process where, during the first phase 202, a deposition process that deposits a blanket layer of a material of suitable stickiness to top-seal the features without depositing on the bottom of the features may be used. In those embodiments, the second phase 204 and the third phase 206 may remain plasma etching processes where the second phase 204 etches the blanket layer and patterned anti-reflection layer, and the third phase 206 etches the features into the layer to be patterned to form the patterned layer illustrated in FIG. 1D.

Though specific amplitudes were used in the descriptions of the electrical potentials of FIG. 2, in various other embodiments, different electrical potential amplitudes may be used. In various embodiments, the electrical potential amplitudes of the waveforms of FIG. 2 are specified according to the material being etched, the material being deposited, and the features being etched during the DCS plasma etching process of the substrate processing method of this disclosure.

An example of the behavior of the elements of the first plasma during the first phase 202 is illustrated in FIG. 3. Further, FIG. 3 illustrates the inside of the plasma processing chamber during the first phase 202 of the DCS plasma etching process described using FIG. 2. In other words, FIG. 3 illustrates the sputtering of the top electrode and subsequent deposition of the sputtered material during the first phase 202 of the DCS plasma etching process of the substrate processing method of this disclosure.

Referring to FIG. 3, the diagram illustrates a top electrode 332 with a plasma 370 disposed between the top electrode 332 and the patterned substrate 100. According to the first phase 202 of FIG. 2, the DCS Potential is high (at −1 kV) and the bottom electrode (which has the patterned substrate 100 disposed on it) is biased with the SP Potential applying an RF Source waveform to ignite the first gas mixture and form the first plasma, or plasma 370. During the first phase 202, because the top electrode is biased with −1 kV by the DCS Potential, positive ions of the plasma 370 are accelerated to sputter the top electrode 332.

In the embodiment illustrated in FIG. 3, the top electrode 332 is silicon, and the first gas mixture is argon, such that an argon plasma is formed and the positive ions of the plasma 370 are argon ions. As an example, an argon ion 312 is illustrated being attracted to the top electrode 332 where a collision 314 produces a secondary electron 310 (which is not energetic enough to leave the plasma 370) and a sputtered silicon 316. After, the sputtered silicon 316 follows the illustrated path to deposit over the patterned substrate 100. And as the first phase 202 progresses in the embodiment illustrated in FIG. 3, a blanket layer is deposited over the patterned substrate 100 comprising a sticky sputtered silicon material, which top-seals the patterned planarizing layer of the patterned substrate 100.

In various embodiments, the thickness of the deposited blanket layer may be controlled by varying the amount of time of the first phase 202 of the DCS plasma etching process of the substrate processing method of this disclosure. For example, the longer the first phase 202 is used, the thicker the blanket layer over the patterned substrate 100 will be, and vice versa.

FIG. 4 illustrates a plasma processing system 400 that may implement the DCS plasma etching process of the substrate processing method of this disclosure in accordance with various embodiments. For example, the plasma processing system 400 may implement the DCS plasma etching process illustrated in FIG. 2. In various embodiments, the plasma processing system 400 may be configured to deposit a blanket layer over a patterned planarizing layer of a patterned substrate to top-seal features and form cavities, and subsequently etch the blanket layer and then pattern etch the features into a layer to be patterned of the patterned substrate.

The deposition of the blanket layer step may comprise using a first gas chemistry that, when ignited into a first plasma, may be used to deposit sufficiently sticky material over the patterned substrate to close the gaps (or top-seal) of the features. The first gas chemistry may be chosen such that the first plasma deposits the sufficiently sticky material over the features without the material accumulating at the bottom of the features. Further, in an embodiment that uses the DCS plasma etching process of FIG. 2, the first plasma may be used to effectively sputter material from the top electrode to deposit the blanket layer over the patterned substrate. The etching of the patterned anti-reflection layer and the blanket layer may comprise using a second gas chemistry that, when ignited into a second plasma, may be used to selectively etch the materials of the blanket layer and the patterned anti-reflection layer and not the material of the layer to be patterned. The etching to pattern the features into the layer to be patterned and form the patterned layer may comprise a third gas chemistry that, when ignited into a third plasma, may be used to selectively etch the material of the layer to be patterned and not the materials of the underlayer or substrate. The plasma processing system 400 may be configured to switch between the first gas chemistry, the second gas chemistry, and the third gas chemistry to implement the substrate processing method of this disclosure.

In an embodiment where the first gas chemistry is used to form the first plasma to sputter a sticky silicon material to form the blanket layer over the patterned substrate, the first gas chemistry used may be one that effectively sputters the top electrode 332 (comprising silicon) and does not comprise fluorine. In various embodiments, any plasma capable of sputtering the top electrode to deposit the blanket layer comprising a highly sticky material may be used, such as plasmas formed from Ar or He gases.

In a similar embodiment where the second gas chemistry is used to etch and remove the blanket layer and the patterned anti-reflection layer of the patterned substrate to open the cavities, the second gas chemistry may comprise any suitable gas chemistry or mixture that, when ignited into a second plasma, may etch and remove both the material of the blanket layer and the material of the patterned anti-reflection layer. For example, gases such as $CHF_3$, $CH_2F_2$, $CH_3F$, $CF_4$, $SF_6$, and $NF_3$ are mixed with Ar, Kr, $O_2$, $CO_2$, $N_2$, $H_2$, $CH_4$, or NO to ensure a high anisotropy may be used.

In a similar embodiment, the third gas chemistry used may be one that selectively etches the layer to be patterned. For example, in an embodiment where the layer to be patterned comprises a dielectric material such as oxides or nitrides or an ONO layer stack, gases such as $CHF_3$, $CH_2F_2$, $CH_3F$, $CF_4$, $SF_6$, and $NF_3$ that are mixed with Ar, Kr, $O_2$, $CO_2$, $N_2$, $H_2$, $CH_4$, or NO may be used. In one or more embodiments, silicon nitride and silicon oxide layers may be etched using $CH_3F/O_2$ and $CH_3F/CO_2$. In other embodiments, silicon nitride and silicon oxide layers may be etched using one or all of $CH_3F$, $CH_2F_2$, and $CHF_3$ combined with $O_2$. Other gases such as Ar, Kr, $N_2$, and etcetera may be used. In various embodiments, any plasma capable of etching the material of the layer to be patterned may be used.

The plasma processing system 400 comprises a plasma processing chamber 450 configured to sustain the plasma 370 directly above the patterned substrate 100 loaded onto a substrate holder disposed on a bottom electrode 410. A process gas, such as the first gas chemistry, the second gas chemistry, or the third gas chemistry mentioned above, may be introduced to the plasma processing chamber 450 through a gas inlet 422 and may be pumped out of the plasma processing chamber 450 through a gas outlet 424. The gas inlet 422 and the gas outlet 424 may comprise a set of multiple gas inlets and gas outlets, respectively. The gas flow rates, the gas chemistry used, and the chamber pressure may be controlled by an inlet gas flow control system 420 coupled to the gas inlet 422. The inlet gas flow control system 420 may also implement the substrate processing method of this disclosure. The outflow gas composition may be monitored using an outlet gas flow control system 426 coupled to the gas outlet 424. In an embodiment, the outflow gas composition results determined by the outlet gas flow control system 426 may be used as a dynamic trigger for switching between the phases of the DCS plasma etching process, such as the DCS plasma etching process illustrated in FIG. 2. In another embodiment, the plasma processing system 400 may switch between the phases of the DCS plasma etching process of the substrate processing method of this disclosure according to the timeframe of each phase included in a feature recipe. The inlet gas flow control system 420 and the outlet gas flow control system 424 may comprise various components such as high-pressure gas canisters, valves (e.g., throttle valves), pressure sensors, gas flow sensors, gas analyzers, vacuum pumps, pipes, and electronically programmable controllers.

The plasma processing system 400 may further comprise a bias power supply 460 electrically coupled with a source power supply 630 which are both electrically coupled to the bottom electrode 410 and configured to provide the superimposed waveform of the SP Potential and the BP Potential illustrated in FIG. 2 to the bottom electrode 410. Further, the plasma processing system 400 may comprise a DCS power supply 431 electrically coupled to the top electrode 332 and configured to supply the DCS Potential illustrated in FIG. 2 to the top electrode 332. The plasma processing system 400 further comprises a dielectric sidewall 416. In FIG. 4, the gas inlet 422 may be an opening in a top plate 412 and the gas outlet 424 may be an opening in a bottom plate 414. The top plate 412 and bottom plate 414 may be conductive and electrically connected to the system ground (a reference potential).

In the embodiment illustrated in FIG. 4, the plasma processing system 400 further comprises a memory 429 coupled to a controller 428. The memory 429 may be any memory device capable of storing instructions to be executed by the controller 428 to perform the substrate processing method of this disclosure. The controller 428 may be any device capable of executing the instructions to perform the substrate processing method of this disclosure stored in the memory 429. The controller 428 is coupled to the source power supply 430, the bias power supply 460, and the DCS power supply 431. Each of the power supplies may be any power source capable of outputting the waveforms illustrated in FIG. 2, such as an RF function generator capable of outputting an RF source to ignite the gases in the plasma processing chamber 450 into the plasma 370.

The plasma processing system 400 illustrated in FIG. 4 is for example only. In various alternative embodiments, the plasma processing system 400 may be configured with different couplings of the source power supply 430, the bias power supply 460, and the DCS power supply 431. In some embodiments, the DCS power supply 431 may not be included if a different deposition process is used to deposit the blanket layer to top-seal the patterned planarizing layer of the patterned substrate 100. In other embodiments, gas inlets and outlets may be coupled to sidewalls of the plasma processing chamber 450. In other embodiments, the outflow gas flow control system 426 does not actively monitor the gas composition of the gas flowing out of the plasma processing chamber 450 through the gas outlet 424.

In another embodiment, the plasma processing system 400 may be capable of depositing and patterning the various layers of the patterned substrate, as well as implement the steps of the substrate processing method of this disclosure (such as the embodiment illustrated using FIGS. 1A-1D). In further embodiments, the plasma processing system 400 may implement the first purge and the second purge steps of the DCS plasma etching process of the substrate processing method of this disclosure described in FIG. 2. The plasma processing system 400 is capable of implementing the substrate processing method of this disclosure in-situ without further processing steps and without moving the patterned substrate between different processing tools.

In an embodiment, the top electrode 332 may be referred to as a first electrode, and the bottom electrode 410 may be referred to as a second electrode. In further embodiments, the plasma processing system 400 may further comprise a third electrode disposed proximate a top of the plasma processing chamber 450 and coupled to a reference potential.

Figure 5:
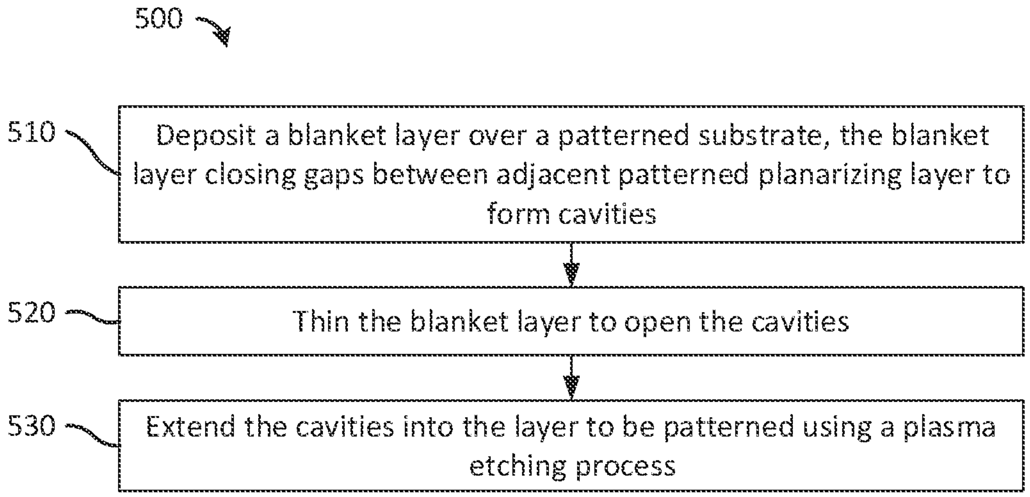
FIG. 5 illustrates a flowchart of an example substrate processing method in accordance with an embodiment.
Figure 6:
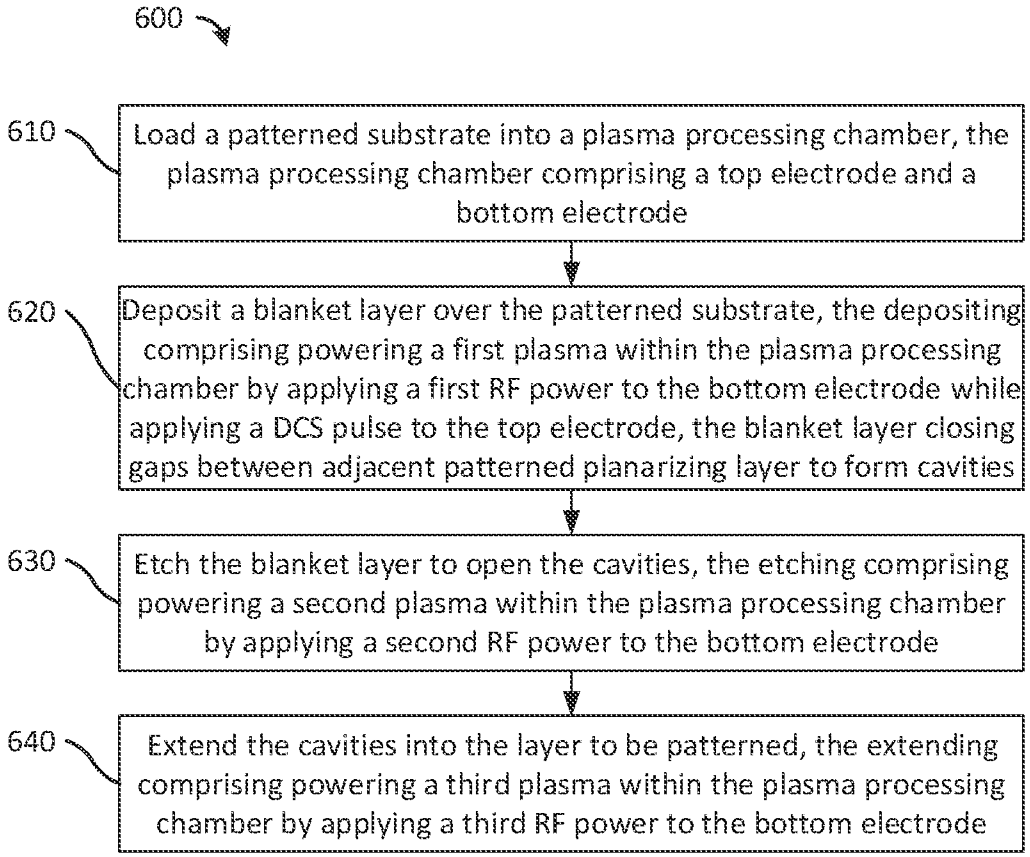
FIG. 6 illustrates a flowchart of another example substrate processing method in accordance with an embodiment.

FIGS. 5-6 illustrate example methods of a substrate processing method in accordance with embodiments of the invention. The methods of FIGS. 5-6 may be combined with other methods and performed using the systems and apparatuses as described herein. For example, the methods of FIGS. 5-6 may be combined with any of the embodiments of FIGS. 1A-1D and FIG. 2. Although shown in a logical order, the arrangement and numbering of the steps of FIGS. 5-6 are not intended to be limited.

Referring to FIG. 5, step 510 of a method 500 of forming channel holes, or holes for contact plugs/vias using a blanket layer over a patterned substrate deposits a blanket layer over a patterned substrate, the blanket layer closing gaps (or top-sealing) between adjacent patterned planarizing layer to form cavities. The patterned substrate comprises a layer to be patterned, a patterned planarizing layer disposed on the layer to be patterned, and a patterned anti-reflection layer disposed over the patterned planarizing layer. For example, step 510 may be illustrated as the step to form the patterned substrate 100 illustrated in FIG. 1B. The deposition of the blanket layer in step 510 may be accomplished by any method known in the art. As another example, the deposition may be performed by sputtering the top electrode like described using the DCS plasma etching process of the first phase 202 of FIG. 2 and illustrated with the diagram of FIG. 3.

Still referring to FIG. 5, step 520 of the method 500 thins the blanket layer to open the cavities and may be illustrated as the cross-sectional view schematic diagram of FIG. 1C. Thinning the blanket layer in step 520 comprises generating a plasma and etching the blanket layer using the plasma. The method 500 then extends the cavities into the layer to be patterned using a plasma etching process in step 530. In an embodiment, the plasma etching process may be the third phase 206 of the DCS plasma etching process illustrated in FIG. 2.

Now referring to FIG. 6, step 610 of a method 600 loads a patterned substrate into a plasma processing chamber, the plasma processing chamber comprising a top electrode and a bottom electrode. In an embodiment, the plasma processing chamber may be the plasma processing chamber 450 of FIG. 4. Again, the patterned substrate comprises a layer to be patterned, a patterned planarizing layer disposed on the layer to be patterned, and a patterned anti-reflection layer disposed over the patterned planarizing layer. Step 620 of the method 600 deposits a blanket layer over the patterned substrate, the depositing comprising powering a first plasma within the plasma processing chamber by applying a first RF power to the bottom electrode while applying a DCS pulse (such as the DCS Potential of FIG. 2) to the top electrode, the blanket layer closing gaps between adjacent patterned planarizing layer to form cavities. For example, the step 620 may be represented by the cross-sectional diagram of FIG. 1B and the plasma processing system 400 of FIG. 4 may be used to perform this step.

Still referring to FIG. 6, step 630 of the method 600 etches the blanket layer to open the cavities, the etching comprising powering a second plasma within the plasma processing chamber by applying a second RF power to the bottom electrode. In an embodiment, step 630 may be the second phase 204 of the DCS plasma etching process illustrated in FIG. 2. In step 640, the method 600 extends the cavities into the layer to be patterned, the extending comprising powering a third plasma within the plasma processing chamber by applying a third RF power to the bottom electrode. Again, the step 640 of the method 600 may be the third phase 206 illustrated in FIG. 2.

Example embodiments of the invention are described below. Other embodiments can also be understood from the entirety of the specification as well as the claims filed herein.

Example 1. A method of processing a substrate in a plasma processing chamber includes loading a patterned substrate within a plasma processing chamber including a sacrificial electrode and a bottom electrode. The method further includes consuming the sacrificial electrode to deposit a blanket layer over a patterned substrate, the patterned substrate including a layer to be patterned, a patterned planarizing layer disposed on the layer to be patterned, and a patterned anti-reflection layer disposed over the patterned planarizing layer, the blanket layer closing gaps between adjacent patterned planarizing layer to form cavities. And the method further includes thinning the blanket layer to open the cavities, and extending the cavities into the layer to be patterned using a plasma etching process.

Example 2. The method of example 1, where the depositing, thinning, and the extending are performed within the plasma processing chamber.

Example 3. The method of one of examples 1 or 2, where the plasma processing chamber includes a first electrode and a second electrode, where depositing the blanket layer includes applying a first RF power to the bottom electrode with a source power supply while applying a DCS pulse to the sacrificial electrode with a DCS power supply so as to deposit the blanket layer over the patterned substrate, where thinning the blanket layer includes applying a second RF power with the source power supply to the bottom electrode, and a first bias power (BP) potential with a bias power supply to the bottom electrode so as to etch the blanket layer, and where extending the cavities includes applying a third RF power with the source power supply to the bottom electrode, and a second BP potential with the bias power supply to the bottom electrode so as to extend the cavities into the layer to be patterned.

Example 4. The method of one of examples 1 to 3, further includes flowing an inert gas prior to depositing the blanket layer, a plasma generated from the inert gas consuming the sacrificial electrode.

Example 5. The method of one of examples 1 to 4, further includes performing a first purge between the depositing and the thinning to flush gases from the plasma processing chamber, and performing a second purge between the thinning and the extending to flush gases from the plasma processing chamber.

Example 6. The method of one of examples 1 to 5, where the blanket layer seals the gaps without depositing at the bottom of the gaps between adjacent patterned planarizing layers.

Example 7. The method of one of examples 1 to 6, where thinning the blanket layer to open the cavities includes performing an etching process to etch the blanket layer and the patterned anti-reflection layer until the cavities are completely open.

Example 8. The method of one of examples 1 to 7, where extending the cavities using the plasma etching process includes using a plasma to etch the layer to be patterned, the plasma including a material that selectively etches the layer to be patterned.

Example 9. The method of one of examples 1 to 8, where the layer to be patterned includes a dielectric material, the patterned planarizing layer includes an organic planarization layer (OPL), the patterned anti-reflection layer includes a silicon doped anti-reflective coating (SiARC), and the cavities are channel holes.

Example 10. The method of one of examples 1 to 9, where the blanket layer includes silicon.

Example 11. The method of one of examples 1 to 10, where the blanket layer includes a mixture of SiARC and silicon.

Example 12. A method of processing a substrate in a plasma processing chamber includes loading a patterned substrate into a plasma processing chamber, the patterned substrate including a layer to be patterned, a patterned planarizing layer disposed on the layer to be patterned, and a patterned anti-reflection layer disposed over the patterned planarizing layer, the plasma processing chamber including a top electrode and a bottom electrode. The method further includes depositing a blanket layer over the patterned substrate, the depositing including powering a first plasma within the plasma processing chamber by applying a first RF power to the bottom electrode while applying a DCS pulse to the top electrode, the blanket layer closing gaps between adjacent patterned planarizing layer to form cavities. The method further includes etching the blanket layer to open the cavities, the etching including powering a second plasma within the plasma processing chamber by applying a second RF power to the bottom electrode. And the method further includes extending the cavities into the layer to be patterned, the extending including powering a third plasma within the plasma processing chamber by applying a third RF power to the bottom electrode.

Example 13. The method of example 12, further includes performing a first purge between the depositing and the etching to flush gases forming the first plasma from the plasma processing chamber. And further includes performing a second purge between the etching and the extending to flush gases forming the second plasma from the plasma processing chamber.

Example 14. The method of one of examples 12 or 13, where the layer to be patterned includes a dielectric material, the patterned planarizing layer includes an organic planarization layer (OPL), the patterned anti-reflection layer includes a silicon doped anti-reflective coating (SiARC), the cavities are channel holes, and the top electrode includes silicon.

Example 15. The method of one of examples 12 to 14, further includes generating a first plasma from a gas mixture including argon, where the first plasma sputters silicon from the top electrode to deposit the blanket layer.

Example 16. The method of one of examples 12 to 15, where the blanket layer includes silicon.

Example 17. The method of one of examples 12 to 16, where the blanket layer includes a mixture of SiARC and silicon.

Example 18. A plasma processing system includes a plasma processing chamber including a first electrode and a second electrode, the first electrode being a sacrificial electrode, the second electrode configured to hold a substrate. The system further includes a direct current superposition (DCS) power supply electrically coupled to the first electrode, a source power supply electrically coupled to the second electrode, and a bias power supply electrically coupled to the second electrode. The system further includes a controller electrically coupled to the plasma processing chamber, the bias power supply, the source power supply, and the DCS power supply. And the system further includes a memory electrically coupled to the controller and storing a set of instructions to be executed by the controller, the set of instructions when executed cause the controller to apply a first RF power to the second electrode with the source power supply while applying a DCS pulse to the first electrode with the DCS power supply so as to deposit a blanket layer over a patterned substrate disposed on the second electrode, the blanket layer closing gaps between adjacent patterned planarizing layer to form cavities, the patterned substrate including a layer to be patterned, a patterned planarizing layer disposed on the layer to be patterned, and a patterned anti-reflection layer disposed over the patterned planarizing layer. The set of instructions when executed further cause the controller to apply a second RF power with the source power supply to the second electrode, and a first bias power (BP) potential with the bias power supply to the second electrode so as to etch the blanket layer. And the set of instructions when executed further cause the controller to apply a third RF power with the source power supply to the second electrode, and a second BP potential with the bias power supply to the second electrode so as to extend the cavities into the layer to be patterned.

Example 19. The plasma processing system of example 18, where the first electrode includes silicon.

Example 20. The plasma processing system of one of examples 18 or 19, further includes a third electrode disposed proximate a top of the plasma processing chamber, where the instructions further include instructions to couple the third electrode to a reference potential, the second electrode disposed proximate a bottom of the plasma processing chamber.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate in a plasma processing chamber, the method comprising:

loading a patterned substrate within a plasma processing chamber comprising a sacrificial electrode and a bottom electrode;

consuming the sacrificial electrode to deposit a blanket layer over the patterned substrate, the patterned substrate comprising a layer to be patterned, a patterned planarizing layer disposed on the layer to be patterned, and a patterned anti-reflection layer disposed over the patterned planarizing layer, the blanket layer closing gaps between adjacent patterned planarizing layers to form cavities;

thinning the blanket layer to open the cavities; and extending the cavities into the layer to be patterned using a plasma etching process.

2. The method of claim 1, wherein depositing the blanket layer, the thinning, and the extending are performed within the plasma processing chamber.

3. The method of claim 2, wherein the plasma processing chamber comprises a first electrode and a second electrode, wherein depositing the blanket layer comprises applying a first RF power to the bottom electrode with a source power supply while applying a DCS pulse to the sacrificial electrode with a DCS power supply so as to deposit the blanket layer over the patterned substrate, wherein thinning the blanket layer comprises applying a second RF power with the source power supply to the bottom electrode, and a first bias power (BP) potential with a bias power supply to the bottom electrode so as to etch the blanket layer, and wherein extending the cavities comprises applying a third RF power with the source power supply to the bottom electrode, and a second BP potential with the bias power supply to the bottom electrode so as to extend the cavities into the layer to be patterned.

4. The method of claim 2, further comprising flowing an inert gas prior to depositing the blanket layer, a plasma generated from the inert gas consuming the sacrificial electrode.

5. The method of claim 2, further comprising:

performing a first purge between depositing the blanket layer and the thinning to flush gases from the plasma processing chamber; and performing a second purge between the thinning and the extending to flush gases from the plasma processing chamber.

6. The method of claim 1, wherein the blanket layer seals the gaps without depositing at a bottom of the gaps between the adjacent patterned planarizing layers.

7. The method of claim 1, wherein thinning the blanket layer to open the cavities comprises performing an etching process to etch the blanket layer and the patterned anti-reflection layer until the cavities are completely open.

8. The method of claim 1, wherein extending the cavities using the plasma etching process comprises using a plasma to etch the layer to be patterned, the plasma comprising a material that selectively etches the layer to be patterned.

9. The method of claim 1, wherein the layer to be patterned comprises a dielectric material, the patterned planarizing layer comprises an organic planarization layer (OPL), the patterned anti-reflection layer comprises a silicon doped anti-reflective coating (SiARC), and the cavities are channel holes.

10. The method of claim 9, wherein the blanket layer comprises silicon.

11. The method of claim 9, wherein the blanket layer comprises a mixture of SiARC and silicon.

12. A method of processing a substrate in a plasma processing chamber, the method comprising:

loading a patterned substrate into a plasma processing chamber, the patterned substrate comprising a layer to be patterned, a patterned planarizing layer disposed on the layer to be patterned, and a patterned anti-reflection layer disposed over the patterned planarizing layer, the plasma processing chamber comprising a top electrode and a bottom electrode;

depositing a blanket layer over the patterned substrate, the depositing comprising powering a first plasma within the plasma processing chamber by applying a first RF power to the bottom electrode while applying a DCS pulse to the top electrode, the blanket layer closing gaps between adjacent patterned planarizing layers to form cavities;

etching the blanket layer to open the cavities, the etching comprising powering a second plasma within the plasma processing chamber by applying a second RF power to the bottom electrode; and extending the cavities into the layer to be patterned, the extending comprising powering a third plasma within the plasma processing chamber by applying a third RF power to the bottom electrode.

13. The method of claim 12, further comprising:

performing a first purge between the depositing and the etching to flush gases forming the first plasma from the plasma processing chamber; and performing a second purge between the etching and the extending to flush gases forming the second plasma from the plasma processing chamber.

14. The method of claim 12, wherein the layer to be patterned comprises a dielectric material, the patterned planarizing layer comprises an organic planarization layer (OPL), the patterned anti-reflection layer comprises a silicon doped anti-reflective coating (SiARC), the cavities are channel holes, and the top electrode comprises silicon.

15. The method of claim 14, further comprising generating a first plasma from a gas mixture comprising argon, wherein the first plasma sputters silicon from the top electrode to deposit the blanket layer.

16. The method of claim 15, wherein the blanket layer comprises silicon.

17. The method of claim 15, wherein the blanket layer comprises a mixture of SiARC and silicon.

18. A method of processing a substrate in a plasma processing chamber, the method comprising:

loading a patterned substrate within a plasma processing chamber comprising a sacrificial electrode and a bottom electrode;

generating a plasma from an inert gas flowed into the plasma processing chamber, the plasma consuming the sacrificial electrode;

depositing a blanket layer over the patterned substrate, the patterned substrate comprising a layer to be patterned, a patterned planarizing layer disposed on the layer to be patterned, and a patterned anti-reflection layer disposed over the patterned planarizing layer, the blanket layer closing gaps between adjacent patterned planarizing layers to form cavities;

after depositing the blanket layer, performing a first purge to flush gases from the plasma processing chamber;

thinning the blanket layer to open the cavities;

after thinning the blanket layer, performing a second purge to flush gases from the plasma processing chamber; and extending the cavities into the layer to be patterned using a plasma etching process.

19. The method of claim 18, wherein the blanket layer comprises silicon.

20. The method of claim 18, wherein depositing the blanket layer comprises applying a first RF power to the bottom electrode with a source power supply while applying a DCS pulse to the sacrificial electrode with a DCS power supply so as to deposit the blanket layer over the patterned substrate, wherein thinning the blanket layer comprises applying a second RF power with the source power supply to the bottom electrode, and a first bias power (BP) potential with a bias power supply to the bottom electrode so as to etch the blanket layer, and wherein extending the cavities comprises applying a third RF power with the source power supply to the bottom electrode, and a second BP potential with the bias power supply to the bottom electrode so as to extend the cavities into the layer to be patterned.

* * * * *